United States Patent
Dennis

(10) Patent No.: US 6,177,040 B1
(45) Date of Patent: Jan. 23, 2001

(54) METHOD FOR MAKING LIGHT TRANSPARENT PACKAGE FOR INTEGRATED CIRCUIT

(75) Inventor: William K. Dennis, Garland, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 08/157,580

(22) Filed: Nov. 24, 1993

(51) Int. Cl.⁷ .......................... B29C 35/02; B29C 70/70; B29C 70/74
(52) U.S. Cl. ................. 264/272.13; 264/272.15; 264/272.17
(58) Field of Search .......... 264/272.15, 272.17, 264/40.1, 275, 294, 272.13

(56) References Cited

U.S. PATENT DOCUMENTS

| | | | |
|---|---|---|---|
| 3,585,272 | * 6/1971 | Shatz | 264/272.17 |
| 3,706,840 | * 12/1972 | Moyle et al. | 264/272.17 |
| 4,203,792 | * 5/1980 | Thompson | 264/272.17 |
| 4,663,833 | * 5/1987 | Tanaka et al. | 264/272.17 |
| 4,701,999 | * 10/1987 | Palmer | 264/272.17 |
| 4,868,638 | * 9/1989 | Hirata | 264/272.17 |
| 5,098,630 | * 3/1992 | Ogiu et al. | 264/272.17 |
| 5,102,828 | * 4/1992 | Marchisi | 264/272.17 |
| 5,108,955 | * 4/1992 | Ishida et al. | 264/272.17 |

* cited by examiner

Primary Examiner—Angela Ortiz
(74) Attorney, Agent, or Firm—Warren L. Franz; Wade James Brady III; Frederick J. Telecky, Jr.

(57) ABSTRACT

A light transparent package (50) for an erasable integrated circuit (12), and a method for fabricating it are disclosed. The package (50) encapsulates a leadframe (14) that carries the circuit (12). The circuit (12) is an erasable integrated circuit, including an erasable programmable read only memory device. A light transparent window material (18) immiscible in molding compound (34) is emplaced conformally on a surface (30) of the circuit (12). The window material (18) is a gel, polymer preform, or other suitable conformal window forming material adherable to both the circuit (12) and to other components of the assembly, and is transparent to light, particularly ultraviolet light, following a curing process. The molding compound (34) and window material (18) are cured in situ in a cavity (22) of a mold (20). The cavity (22) has at least one contact surface (26) that compresses the window material 18 to form a flattened surface (32) between the window material 18 and the contact surface (26) of the cavity (22). The molding compound (34), which is immiscible in the window material (18), is inserted into the cavity (22) to form the package (50) around the circuit (12) after curing. The molding compound (34) surrounds the circuit (12), a portion of the leadframe (14), and the window material (18), but does not dispose itself on the flattened surface (32). The flattened surface (32) forms the exposed window surface (52) of the light transparent window (54) in the protective package (50) after curing.

9 Claims, 2 Drawing Sheets

METHOD FOR MAKING LIGHT TRANSPARENT PACKAGE FOR INTEGRATED CIRCUIT

BACKGROUND OF THE INVENTION

Field of the Invention

This invention relates to improvements in integrated circuit protective packages and in methods for manufacturing same. More specifically, this invention relates to improvements in protective packages for erasable programmable read only memory devices (conventionally, "EPROMs"). In particular, this invention relates to fabrication of a light transparent window in a molded protective package for an EPROM.

BACKGROUND INFORMATION

An EPROM circuit of the type of interest herein is an erasable programmable read only integrated circuit in which memory circuitry is erasable by exposure to light. Following such exposure, electric charge on the memory cells is dissipated, and consequently data stored in the memory cells is removed, or erased, from the circuit. Thereafter, new data may be programmed into the circuit in known manner. One form of light used to irradiate an EPROM is ultraviolet ("UV") light.

Generally, EPROM devices are sealed in packages to protect the EPROMs from damage during transit between the manufacturer and the end user, from damage during use of the EPROM, and to insure reliability of the circuit. In EPROM circuit packages, a window is typically provided through which light, generally light in the UV wavelength region, may pass to irradiate the contained memory circuit.

A variety of methods are used to form integrated circuit packages, while also providing a light transparent window to the circuit. One variety of packages include those that are molded around the contained integrated circuit. For example, a package may be fabricated by providing a circuit mounted on a circuit board, and applying a light transparent epoxy resin over the circuit. The light transparent epoxy resin is cured to form a light transparent cover over the circuit. Such a method has several limitations, including being package outline specific, thus limiting the market for the fabricated package. Further, UV transparent epoxy resin has a thermal expansion coefficient substantially greater than standard plastic molding compounds, which introduces reliability problems in the circuit. In such conventional packages, little, if any, effort is made to select a conformable epoxy resin, or to shape the quantity of epoxy resin applied to the circuit. Consequently, the thickness of the cured epoxy resin may vary from package to package. Further, differences in thickness may distort the incidence of light transmitted through the cured epoxy cover.

Another method for fabricating an EPROM package is to manufacture a hermetically sealed protective package that includes a ceramic lid with a UV transparent lens. A variety of such ceramic packages exist. Most of the various ceramic packages belong to one of three major groups: (i) packages which have a ceramic or metal base and lid, and an all glass wall; (ii) packages which have a ceramic wall, base, and lid; and (iii) packages which have a glass base and wall, and a glass, ceramic, or metal lid. The UV transparent lens permits irradiation of the EPROM circuit through the lens. The lens often is made of quartz, which in turn has dictated that the protective package materials be made of carbon, graphite, and compounds of barium and titanium because of the nonwetting characteristic of the glass with respect to carbon and graphite.

Fabrication of the individual components of ceramic packages and assembly of the packages themselves are expensive in comparison with encapsulated or plastic molded packages. For example, each lens must be individually constructed at significant cost. Because each lens is not constructed or fabricated integrally with other components of the finished package, each lens must be individually mounted on a separately manufactured lid, a step in the manufacturing process which further increases the price of the finished product. The lid of the protective package that houses the lens must be manufactured with a special recess, depression, or preformed aperture to receive the lens, another step that adds to the cost of the finished package.

In addition, it has been common practice to hermetically seal the transparent lens in the preformed aperture, a step necessitating sandwiching the lid and lens within paired fixtures, which fit together. Following the step of fitting the fixtures together, the protective package assembly is fired to form the desired hermetic seal between the lens and the lid. The firing process often deposits foreign particles on the lens, principally carbon, and the lens surface also may be damaged from the process of firing. Particle deposition on the lens surface inhibits the ability of the lens to transmit UV light through the lens without diffusing the light. To remove such foreign particles, a solvent may be applied to clean the surface of the lens. However, that step may further roughen the surface of the lens. The roughened surface may then have to be further fired to fire-polish the surface of the lens. All of the foregoing steps are time consuming and expensive, and each step may itself induce impurities or a rough surface on the lens requiring additional expensive steps to correct.

Much of the cost of an integrated circuit of any kind is incurred in the packaging. The costs associated with fabricating and assembling conventional plastic molded protective packages for integrated circuits is much less than the costs associated with fabricating and assembling a ceramic type of protective package. Economics and market demand indicate a need to provide for a light transparent plastic package for an EPROM, particularly an ultraviolet light transparent window.

Accordingly, there is a need to provide an EPROM protective package with a light transparent window to substantially reduce the costs associated with producing conventional ceramic hermetically sealed protective packages for EPROMs, particularly a window which is transparent to ultraviolet light.

SUMMARY

In light of the above, therefore, it is an object of the invention to provide an improved package, and method for making the improved package, for an integrated circuit having light erasable elements.

Another object of the invention is to provide an EPROM package having a light transparent window that is inexpensive to produce and assemble in comparison with prior packages.

Yet another object of the invention is to provide an EPROM package that has a UV transparent window, and which can be formed into a wide variety of package outlines, such as Chip-On-Board ("COB") applications, DIPS, chip carriers, and other integrated circuit structures.

Another object of the invention is to provide an EPROM package assembly that provides a UV receptive window to erase the EPROM, and which may be fabricated from inexpensive light transparent compounds.

A technical advantage of a plastic EPROM package with a light transparent window constructed according to the invention is substantially reduced fabrication and assembly costs are associated with the package.

Another technical advantage of the preferred embodiment of the invention is that fabrication of a window integral with the package that is transparent to ultraviolet light is enabled.

Yet another technical advantage of a plastic EPROM package with a light transparent window constructed according to the invention is that fabrication of the device is possible in a wide variety of package outlines. The invention is not limited to use in connection with a particular outline such as COB, DIP, or any other limited use.

Another technical advantage of a plastic EPROM package with a light transparent window constructed according to the invention is that increased protection is afforded the EPROM by the finished package, in comparison with other varieties of EPROM packaging.

According to a broad aspect of the invention, an integrated circuit having light erasable elements includes a light transparent material having a top, a bottom, and lateral sides. The bottom side is located conformally on a first region of the integrated circuit overlying the light erasable elements. The top side of the light transparent material defines a window that has an exposed surface for passing light to the light erasable elements. The light transparent material is of the type that is conformal and is adherable to the circuit, before being cured, and preferably is a polymer preform, a gel, or other form of a material that is transparent to light, preferably ultraviolet light. A molding compound encapsulates second regions of the circuit and the lateral sides of the transparent material. In a preferred embodiment of the invention, the window is substantially continuous, preferably substantially coplanar, with a surface of the package.

According to another broad aspect of the invention, a method for making a package having a light transparent window is presented. In performing the method, a specially selected conformal light transparent window material is placed on the circuit. The selective criterion for the window material, which will form the window in the protective packaging, includes being immiscible in any molding compound that is used in connection with the invention. The window material is a conformal material that adheres to the surface of the circuit on which it is located, to the assembly structure, and to plastic surfaces in general. The window material retains plasticity of character until cured, for example, by heat, and may be a gel or a polymer preform. The window material is transparent to light of predetermined wavelengths, such as UV, or the like, after being cured in the final structure.

The circuit, the leadframe, and the window material that has been placed on the circuit, are placed within a mold. The mold has a cavity that encloses at least a portion of the leadframe, the circuit, and the window material. In general, the cavity in the mold forms a box having six surfaces. At least one of the six surfaces is a contact surface. The purpose of the contact surface is to compress the window material that has been deposited on the circuit after the circuit has been inserted into the cavity of the mold. By compressing the window material a substantially flat surface is formed in the window material between the window material and the contact surface. It is the substantially flat surface that ultimately forms the exposed surface of the light transparent window in the package when the formed package is removed from the mold.

The molding compound material and the window material are cured by heating the materials within the mold. After cooling, the encapsulated circuit is removed from the mold. The molding compound material and window molding material have formed a plastic protective enclosure around the circuit and the leadframe. Further, where the flat surface of the window material was in contact with the contact surface, an exposed surface of a light transparent window exists, formed of the window material. The light transparency of the window may be confirmed by testing.

The features of this invention may be best understood from the detailed description below, when read in conjunction with the appended claims and accompanying drawing in which like reference characters refer to like or similar parts, and in which:

BRIEF DESCRIPTION OF THE DRAWING

In the various drawings, like reference numerals are used to denote like or similar parts. Additionally, the drawings are not necessarily drawn to scale.

DESCRIPTION OF THE PREFERRED EMBODIMENTS

It should be noted that the process steps and structures herein described do not necessarily form a complete process flow for manufacturing integrated circuit packages. It is anticipated that the present invention may be practiced in conjunction with integrated circuit package fabrication techniques currently used in the art, and only so much of the commonly practiced process steps is included as is necessary for an understanding of the invention.

Figure 1:
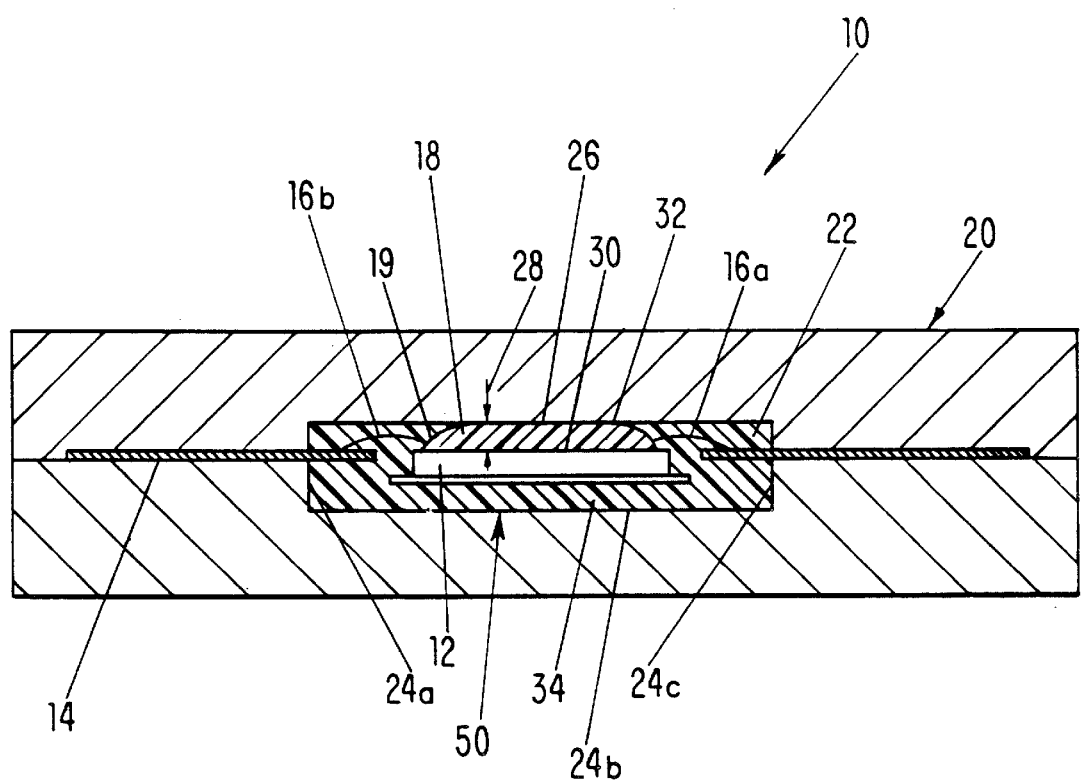
FIG. 1 is a cross-sectional view of a molding apparatus for forming a package in accordance with a preferred embodiment of the invention, including a contained package being formed, with a window element, in accordance with the invention.

Referring first to FIG. 1, a molding apparatus for forming a package that is particularly suited to contain an integrated circuit having erasable elements, in accordance with the invention, is shown and generally designated by the reference numeral 10. In the drawing, the molding apparatus 10 contains a leadframe 14 that carries an integrated circuit 12 that is electrically connected to various portions of the leadframe 14 by a series of wire bonds 16a,b. The leadframe 14 is not limited to any particular shape or configuration, and may employ any number of leads, fabricated of any of a variety of leadframe materials. The integrated circuit 12 may contain any of a variety of erasable integrated circuits, including an erasable programmable read only memory devices, which are common in the integrated circuit industry, and which are erasable by exposure to light, particularly ultraviolet light.

Figure 2:
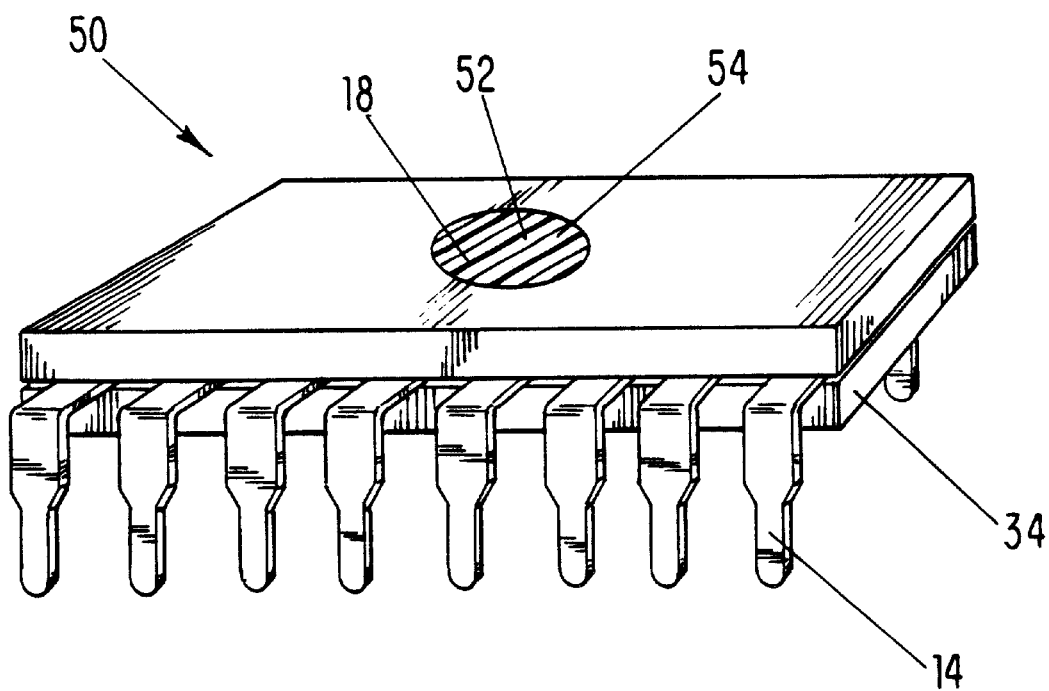
FIG. 2 is a perspective view of a molded protective package formed with a light transparent window having an exposed surface, in accordance with a preferred embodiment of the invention.

As further shown with reference now both to FIGS. 1 and 2, the package 50 produced by the molding apparatus 10 includes a conformal window material 18 located on at least the erasable elements of the circuit 12. The criteria for selecting the window material 18 include being immiscible in the molding compound 34 that is used in making the surrounding package, being conformal to the circuit and contact surface (below described), and being adherent to the circuit 12, the leadframe 14, the wire bonds 16a,b, and the molding compound surrounding the circuit. Thus, the window material 18 may be selected from one or more of a variety of materials that are conformal at least at the temperatures of the molding process, including gels selected from silicones, epoxies, and similar materials, and polymer preforms having the desired characteristics set forth herein, or any other compressible window material that is light transparent in position on circuit 12 following a curing process, and preferably, are transparent to ultraviolet light following the curing process.

As further shown in FIG. 1, the molding apparatus 10 for fabrication of package 50 includes a mold 20 having a cavity 22. The mold 20 may be fabricated of any of a variety of materials used in the fabrication of integrated circuit molds, and which are well known in the art. In a preferred embodiment, the cavity 22 of the mold 20 is formed with five surfaces 24a, b, c (and two of which are not shown) that do not contact the window material 18, and at least one surface or surface 26 that contacts the window material 18. The circuit 12, the leadframe 14, the wire bonds 16a,b, and a mass of window material 18 that has been located on circuit 12, are placed within cavity 22 of mold 20.

The amount of window material 18 that is necessary to form the window of desired size is a function of the distance 28 between the surface 30 of circuit 12 that is desired to be exposed and the contact surface 26 of the cavity 22 of the mold 20. The amount of window material 18 that is used should be sufficient to provide a quantity of window material having a height greater than distance 28, so that it will be compressed by the contact surface 26 of the cavity 22. The compression of the window material 18 forms a substantially flat surface 32 on the window material 18 at the contact surface 26 of the cavity 22 of the mold 20. The mass of light transparent window material 18 has a top side that will form the exposed surface 52 of the window. It additionally has a bottom side that is conformally located on the surface 30 of at least the portion of the integrated circuit chip 12 that has the light erasable elements. Also, it has lateral sides 19.

As shown in FIG. 1, a molding compound 34 is inserted into the cavity 22, for example, via injection ports (not shown) to surround the portion of the leadframe 14 within the cavity 22, the portions of the integrated circuit 12 that are not encapsulated by the window material 18, and the window material 18 that is not in contact with the contact surface 26. Thus, as well as providing the major portion of the encapsulating package, encapsulating those regions of said circuit that are not encapsulated by the mass of window material 18, the molding compound 34 also sealingly engages the lateral sides 19 of the mass of window material 18. Since the molding compound 34 is formed prior to the curing process, it adheres to and conformally surrounds the mass of window material 18 to thereby assure a tight, sealing fit thereto.

The molding compound 34 is of a material that is immiscible in the window material 18, and may be of any of a variety of molding compounds well known in the art. The molding compound 34 surrounds circuit 12, leadframe 14, wire bonds 16a,b and the lateral sides of the window material 18. However, as shown in FIG. 1, the molding compound 34 is excluded from the portion of the window material 18 that is in contact with the compression surface 32.

The materials within the assembly structure 10 are cured in situ by the application of heat. After curing, the materials are cooled, and the package encasing the integrated circuit, as well as the leadframe 14, are removed from the molding apparatus 10, resulting in a package with a light transparent window for an integrated circuit having light erasable elements. It should be noted that the exposed upper surfaces of the mass of window material 18 and the molding compound 34 are substantially continuous, since they were formed against the same surface 26 within the mold cavity. Preferably, they are substantially coplanar, as well.

A package 50 embodiment that has been fabricated in accordance with the method described above with reference to FIG. 1, is shown in FIG. 2, and generally designated by the reference numeral 50. In the particular embodiment of FIG. 2, a dual-in-line package configuration has been formed, with the outboard portions of the leadframe bent and trimmed to form the contact leads 14, as shown. The molding compound 34 is shown having formed upper and lower portions of the package 50 to enclose the circuit 12 and the interior portion of the leadframe 14. As further shown in FIG. 2, where the compression surface 32 previously was in contact with contact surface 26 of cavity 22 of mold 20 during the fabrication process, an exposed surface 52 of a window 54 exists, formed of the window material 18. The light transparency of the window 54 may be confirmed by testing.

It should be noted that the method and apparatus for forming the package 50 has been described above with specific reference to injection molding techniques, the invention can be practiced by other techniques as well. For example, molding techniques of the type in which a charge of molding compound is placed in a mold, then excess compound compressively expelled can be equally advantageously employed. In such case, as in the example described above, the mass of transparent window material can be first placed on the integrated circuit, then the molding compound placed in its generally surrounding regions. As the mold compresses the materials, the top side window is formed, and the window material is pushed conformally against the integrated circuit. Simultaneously, the molding compound is squeezed to conformally encapsulate the regions of the integrated circuit not encapsulated by the window material, as well as the lateral sides of the window material and the inboard leadframe portions.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A method for manufacturing a light transparent window in a package for an integrated circuit having elements erasable by light; comprising the steps of:

placing a conformal window forming material on a surface of said integrated circuit containing said elements;

placing said circuit and said conformal material in a cavity of a mold;

causing a contact surface of said mold to engage a portion of said conformal window forming material at said contact surface, wherein said conformal window forming material has lateral sides between said contact surface and said integrated circuit;

with said contact surface engaging said portion of said conformal material, inserting molding compound into said mold cavity, wherein said molding compound is formed to encapsulate said integrated circuit and said lateral sides;

curing said molding material and said conformal window forming material to form said package; and removing said package from said mold.

2. A method for manufacturing an encapsulated integrated circuit package having a transparent window for communicating light between an exterior of said package and circuit elements located on an integrated circuit contained within said package; said method comprising the steps of:

placing a window forming material on a surface of said integrated circuit containing said elements;

placing said circuit and said window forming material in a cavity of a mold;

causing a contact surface of said mold to contact said window forming material, to compressively engage said window forming material between said contact surface and said surface of said integrated circuit;

with said contact surface in contact with said window forming material, inserting uncured molding compound into said mold cavity to cause the molding compound to surround and encapsulate parts of said integrated circuit not covered by said window forming material and parts of said window forming material not in contact with said contact surface;

curing said molding compound; and removing said cured molding compound, integrated circuit and window forming material from said mold.

3. A method as in claim 2, wherein said molding compound is a heat curable compound; and said curing step comprises heating said molding compound.

4. A method as in claim 3, wherein said contact surface is a planar surface.

5. A method for manufacturing an encapsulated integrated circuit package having a transparent window for communicating light between an exterior of said package and circuit elements located on an integrated circuit contained within said package; said method comprising the steps of:

placing a quantity of uncured, curable conformal window forming material on a surface of said integrated circuit containing said elements;

placing said circuit and said uncured window forming material in a cavity of a mold;

causing a first portion of a contact surface of said mold to contact said uncured window forming material and compress said uncured window forming material between said contact surface and said surface of said integrated circuit, forming a first surface on said window forming material at said contact with said first portion;

with said contact surface in contact with said first surface on said window forming material, inserting uncured, curable molding compound into said mold cavity and into contact with a second portion of said contact surface, to cause said molding compound to surround and encapsulate parts of said integrated circuit not covered by said window forming material and parts of said window forming material not in contact with said contact surface, and forming a second surface on said molding compound at said contact of said molding compound with said second portion of said contact surface; said second surface being continuous with said first surface;

curing said window forming material;

curing said molding compound; and removing said cured molding compound, integrated circuit and cured window forming material from said mold.

6. A method as in claim 5, wherein said window forming material is a heat curable material; said molding compound is a heat curable compound; and said curing steps comprise heating said window forming material and heating said molding compound.

7. A method as in claim 6, wherein said contact surface is a planar surface; said first surface is a flat surface; and said second surface is a flat surface which is coplanar with said first surface.

8. A method as in claim 7, wherein, in said insertion step, said molding compound is injected via injection ports into said cavity.

9. A method as in claim 5, wherein said contact surface is a planar surface; said first surface is a flat surface; and said second surface is a flat surface which is coplanar with said first surface.

* * * * *